(12) United States Patent
Hung

(10) Patent No.: US 8,148,633 B2
(45) Date of Patent: Apr. 3, 2012

(54) HOUSING FOR AN ELECTRONIC APPARATUS

(75) Inventor: Kuang-Hui Hung, Taipei (TW)

(73) Assignees: Silitek Electronic (Guangzhou) Co., Ltd., Guangzhou (CN); Lite-On Technology Corporation, Taipei (TW)

( * ) Notice: Subject to any disclaimer, the term of this patent is extended or adjusted under 35 U.S.C. 154(b) by 826 days.

(21) Appl. No.: 12/232,628

(22) Filed: Sep. 22, 2008

(65) Prior Publication Data
US 2009/0168311 A1 Jul. 2, 2009

(30) Foreign Application Priority Data
Dec. 28, 2007 (CN) .......................... 2007 1 0033040

(51) Int. Cl.
*H05K 5/00* (2006.01)
(52) U.S. Cl. .......... 174/50; 174/520; 174/559; 174/560; 361/679.01; 361/379.58
(58) Field of Classification Search .................... 174/50, 174/520, 559, 560, 561, 562, 563, 535, 545; 361/600, 601, 679.1, 679.02, 679.3, 679.56, 361/679.58, 724, 726, 730, 732, 752, 759, 361/796, 801; 455/575.1
See application file for complete search history.

(56) References Cited

U.S. PATENT DOCUMENTS

| | | | | |
|---|---|---|---|---|
| 5,613,237 A * | 3/1997 | Bent et al. | ...................... | 361/752 |
| 6,111,760 A * | 8/2000 | Nixon | ............................. | 361/801 |
| 6,570,088 B1 * | 5/2003 | Depp et al. | ........................ | 174/50 |
| 7,436,653 B2 * | 10/2008 | Yang et al. | ............... | 361/679.01 |
| 7,647,079 B2 * | 1/2010 | Zuo et al. | .................... | 455/575.1 |
| 7,697,269 B2 * | 4/2010 | Yang et al. | ............... | 361/679.01 |
| 7,800,891 B2 * | 9/2010 | Shi et al. | .................. | 361/679.01 |
| 7,944,690 B2 * | 5/2011 | Yamagiwa | ............... | 361/679.56 |

* cited by examiner

*Primary Examiner* — Angel R Estrada
(74) *Attorney, Agent, or Firm* — Li&Cai Intellectual Property (USA) Office

(57) ABSTRACT

A housing for an electronic apparatus includes a first cover having at least one wedging hook, a second cover having at least one wedging structure that matches at the least one wedging hook, and a third cover having at least one convex block. The convex block of the third cover extends into the wedging structure of the second cover to lock with the wedging hook of the first cover with the wedging structure. The housing can be applied to a cell phone, PDA and other electronic apparatus.

15 Claims, 15 Drawing Sheets

HOUSING FOR AN ELECTRONIC APPARATUS

BACKGROUND OF THE INVENTION

1. Field of the Invention

The present invention generally relates to a housing, and more specifically to a housing for an electronic apparatus.

2. Description of the Related Art

With the development of the technology, portable electronic apparatuses are becoming more and more popular. For example, cell phones, PDAs, and etc. in the portable electronic apparatuses have gained popular usage now. However, the housing configuration of an electronic apparatus is generally assembled by the following two ways. The first way is that the housing configuration is assembled by screws. The second way is that an upper shell and a lower shell are wedged together to form the housing configuration.

The housing by using the first way uses screws thereby requires additional elements. The structure is thus more complex, and the inner space of the electronic apparatus is occupied. It is inconvenient for the user to assemble and maintain.

The housing composed by the second way (the wedging way) usually has an upper shell and a lower shell. One of the shells has a wedging hook. The other shell has a corresponding concave opening. By matching the wedging hook and the concave opening, the housing can be manually disassembled and replaced. It is convenient for the user to assemble and maintain. However, via the second way, the convenience for the user to assemble or disassemble versus the stability of the housing being assembled can not be simultaneously satisfied. For example, in order to easily disassemble the housing, a hook portion of the wedging hook will be shorter so that the wedging hook is easily disassembled from the concave opening, thereby the stability of the housing being assembled is inadequate. In order to prevent the wedging hook from departing from the concave opening unintentionally, the hook portion can be designed longer. However, when the housing needs to be removed and replaced, the wedging hook can not be easily disassembled from the concave opening. Thereby it is inconvenient for the user.

Therefore, how to design a housing of a portable electronic apparatus that can be easily disassembled and at the same time maintain adequate stability of the housing being assembled is an issue worth considering.

SUMMARY OF THE INVENTION

One particular aspect of the present invention is to provide a housing for an electronic apparatus. The housing can be easily disassembled and assembled, and the housing is firmly fastened.

The housing of the electronic apparatus includes a first cover having at least one wedging hook, a second cover having at least one wedging structure that matches the wedging hook, and a third cover having at least one convex block. The convex block of the third cover extends into the wedging structure of the second cover to lock-on the wedging hook of the first cover with the wedging structure.

Furthermore, the first cover includes an inner bottom surface. The wedging hook extends from the inner bottom surface. The second cover includes an inner side wall, and the wedging structure is located on the inner side wall. The third cover includes an inner side wall, and the convex block extends from the inner side wall.

In one embodiment, the second cover further includes an outer side wall, and at least one convex part is located on the outer side wall. The inner side wall of the third cover has at least one concave opening. The convex part of the second cover can be wedged with the concave opening of the third cover. Alternatively, the outer side wall of the second cover has at least one concave opening, and the inner side wall of the third cover has at least one convex part. The convex part of the third cover can be wedged with the concave opening of the second cover.

The first cover is wedged with the second cover via the wedging hook of the first cover and the wedging structure of the second cover, and the third cover is wedged with the second cover via the convex part of the third cover and the concave opening of the second cover. The convex block of the third cover extends into the wedging structure of the second cover to lock-on the first cover with the second cover. The present invention does not need additional elements (such as screws) to assemble the housing of the electronic apparatus. Its structure is simple, the cost is low, and the housing can be easily assembled and disassembled.

For further understanding of the present invention, reference is made to the following detailed description illustrating the embodiments and examples of the present invention. The description is for illustrative purpose only and is not intended to limit the scope of the claim.

BRIEF DESCRIPTION OF THE DRAWINGS

The drawings included herein provide a further understanding of the present invention. A brief introduction of the drawings is as follows.

DETAILED DESCRIPTION OF PREFERRED EMBODIMENTS

Figure 1:
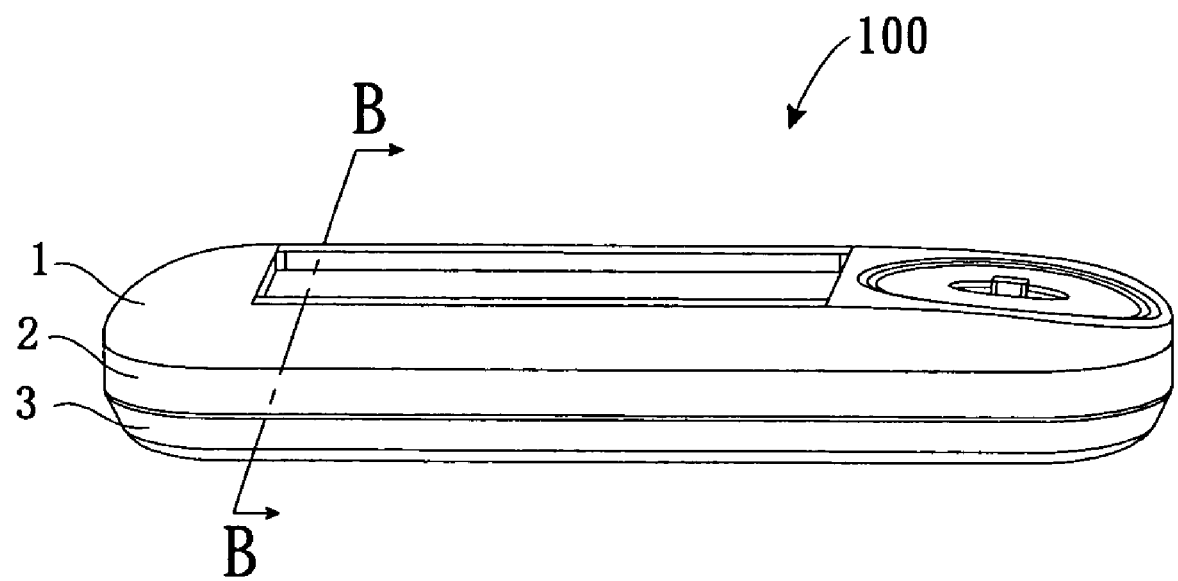
FIG. 1 is an assembly schematic diagram of a housing of an electronic apparatus of a first embodiment of the present invention.
Figure 2:
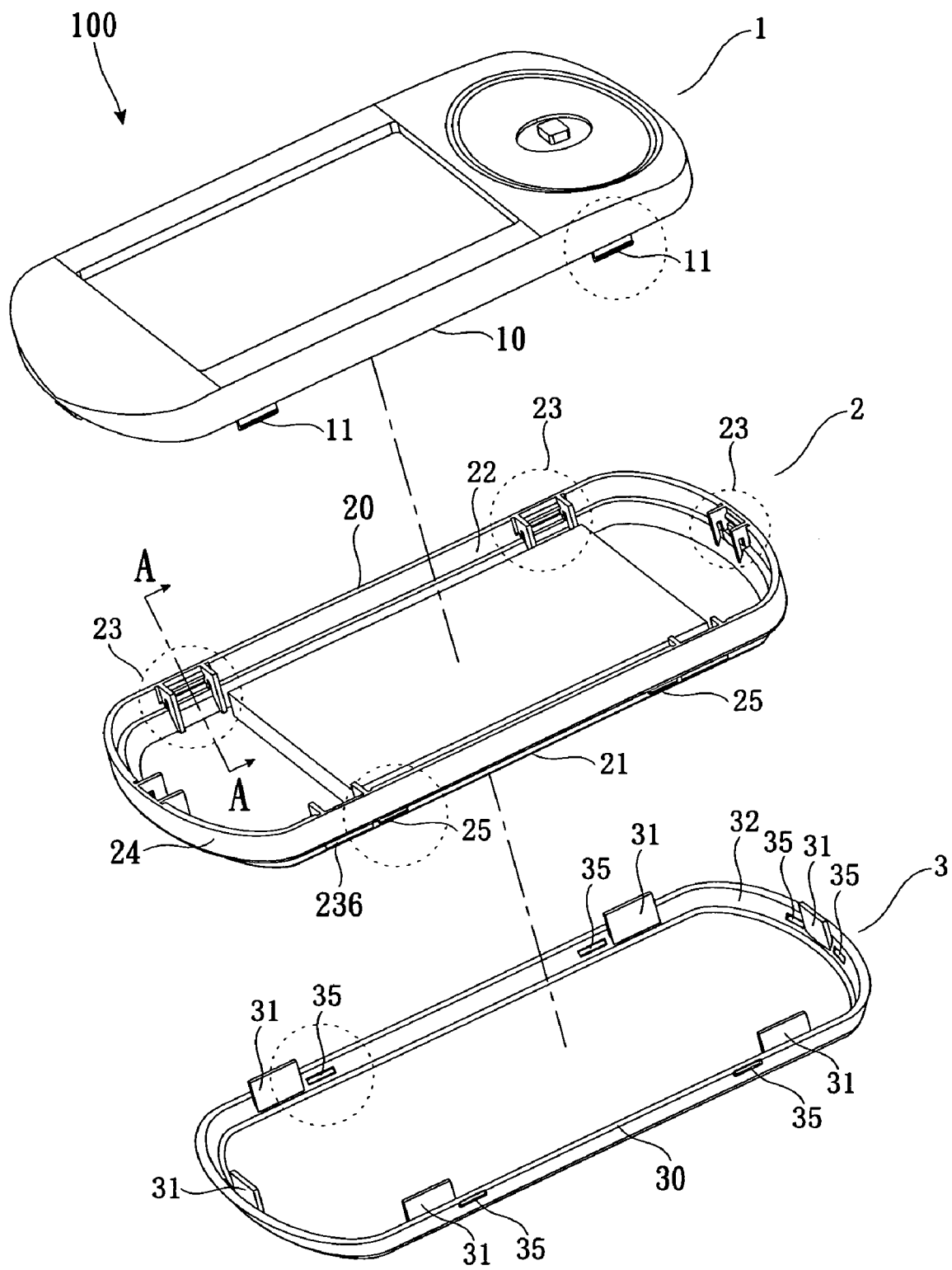
FIG. 2 is an exploded perspective view of the housing of the electronic apparatus of the first embodiment of the present invention.
Figure 3:
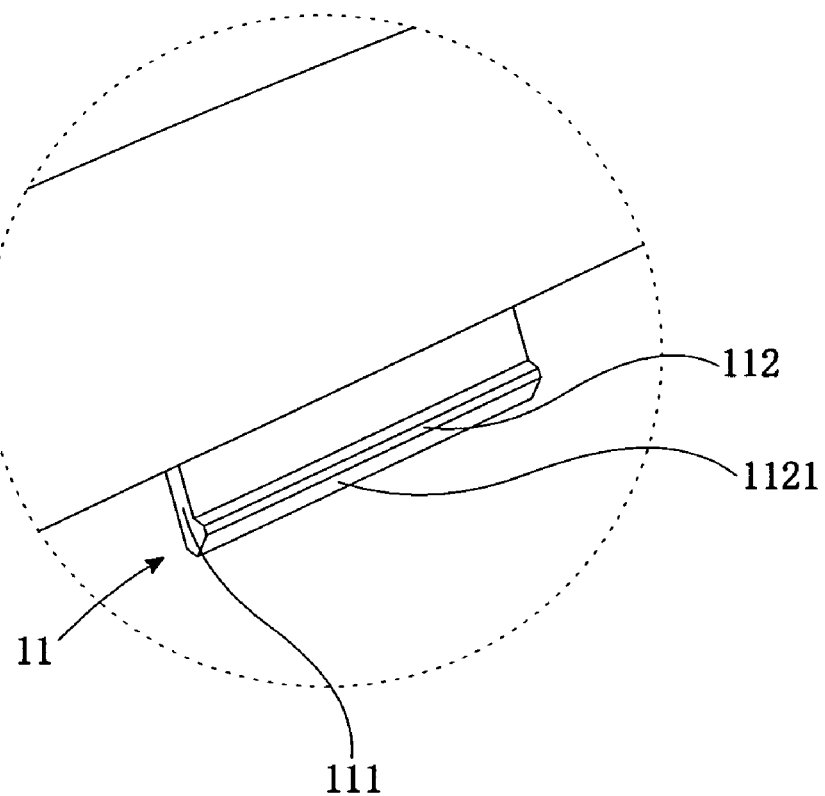
FIG. 3 is an amplified diagram of a first cover of the housing of the electronic apparatus of the first embodiment of the present invention in FIG. 2 for showing the structure of a wedging hook.
Figure 4:
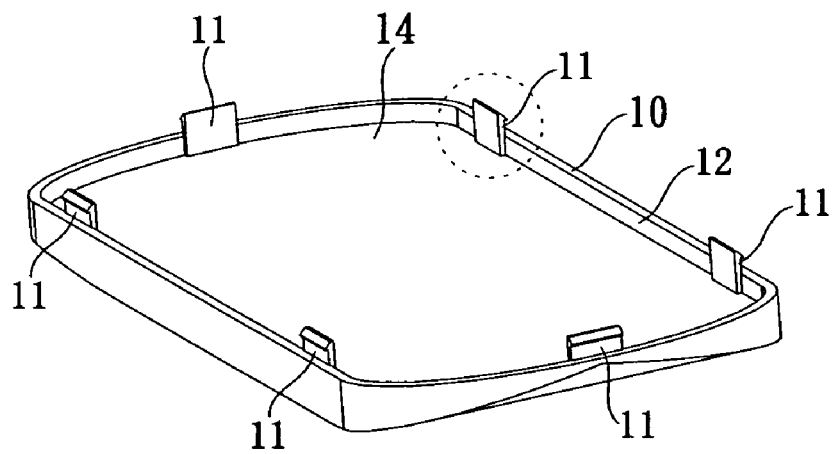
FIG. 4 is a bottom view of the first cover of the housing of the electronic apparatus of the first embodiment of the present invention.
Figure 5:
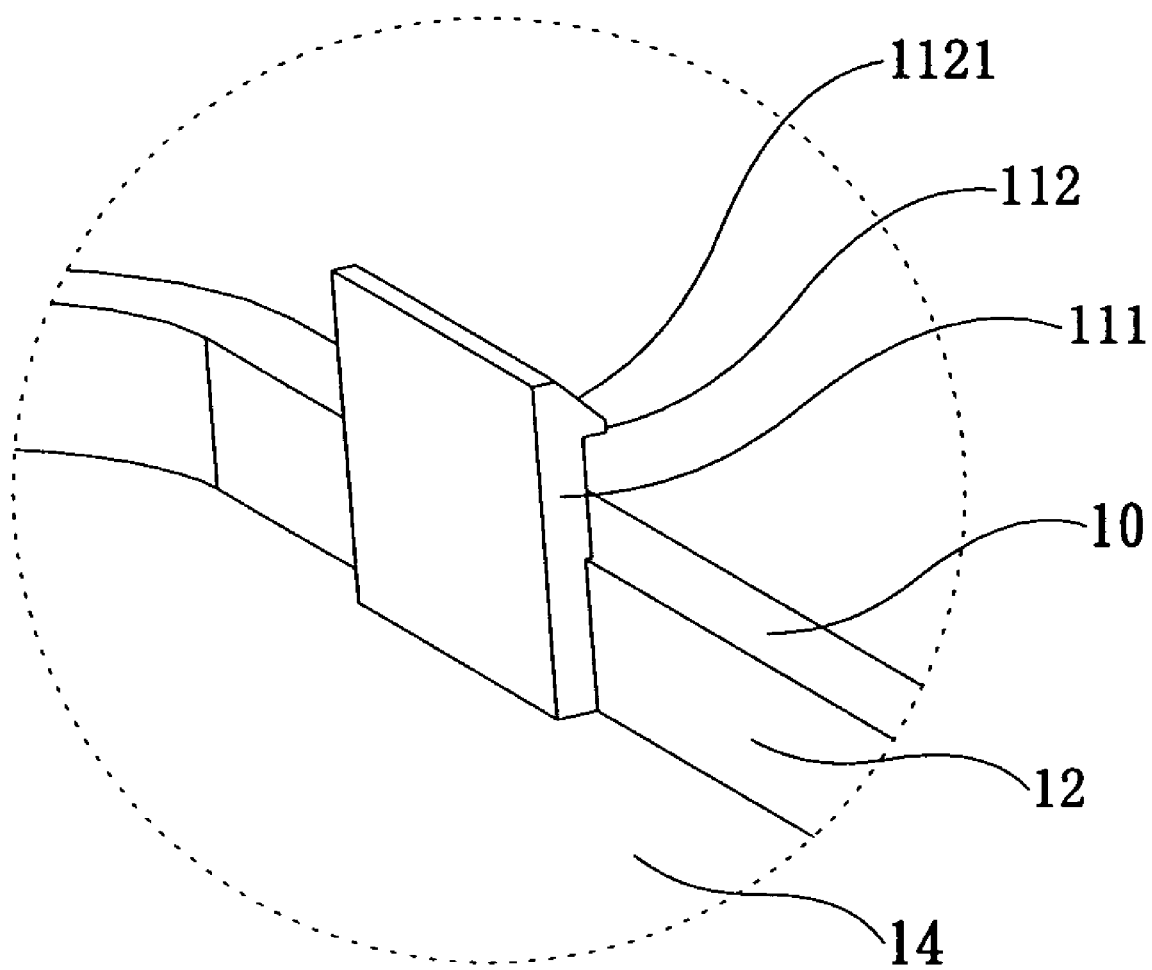
FIG. 5 is an amplified diagram of the first cover of the housing of the electronic apparatus of the first embodiment of the present invention in FIG. 4 for showing the structure of the wedging hook in the top view.
Figure 6:
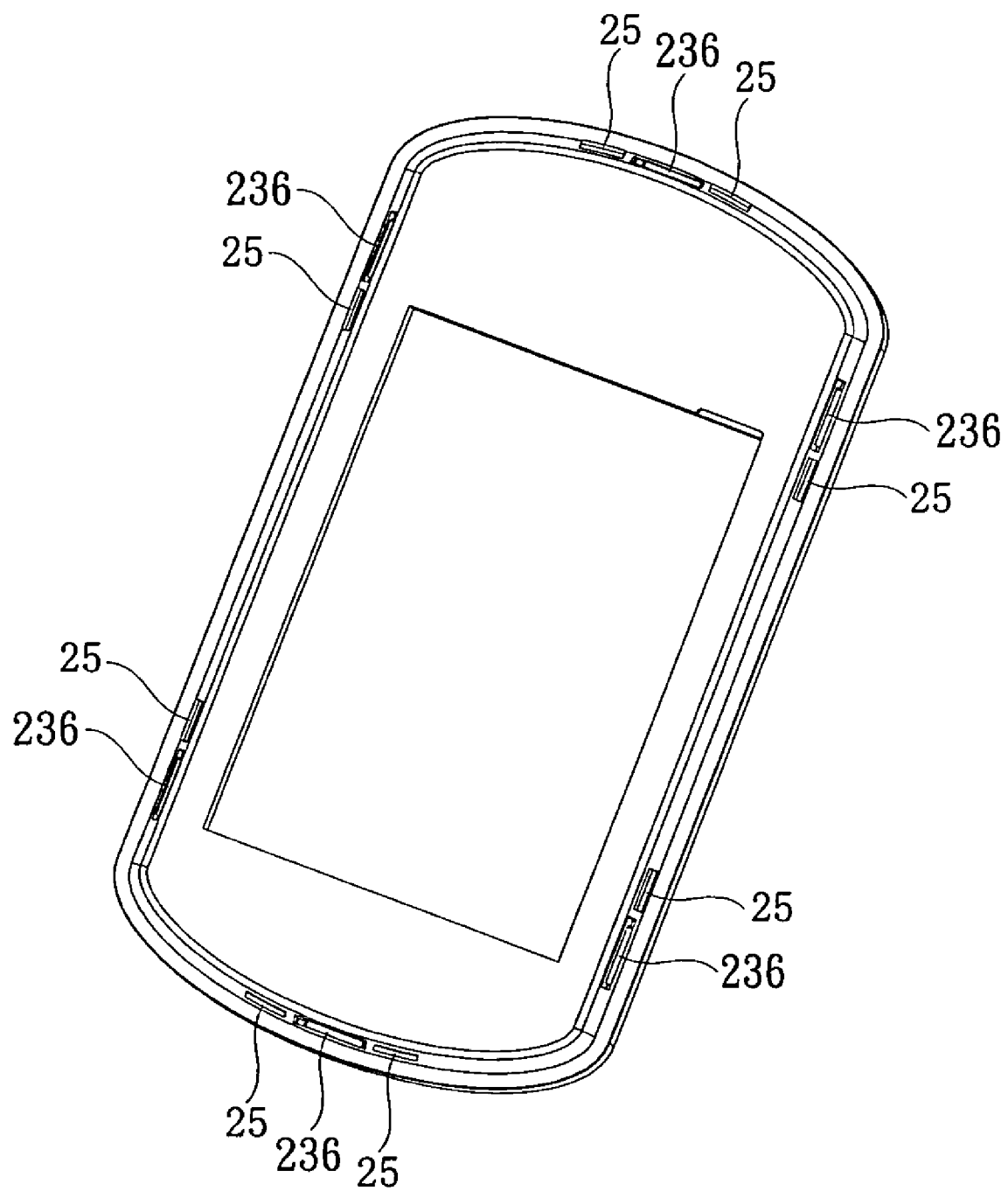
FIG. 6 is a bottom view of a second cover of the housing of the electronic apparatus of the first embodiment of the present invention.
Figure 7:
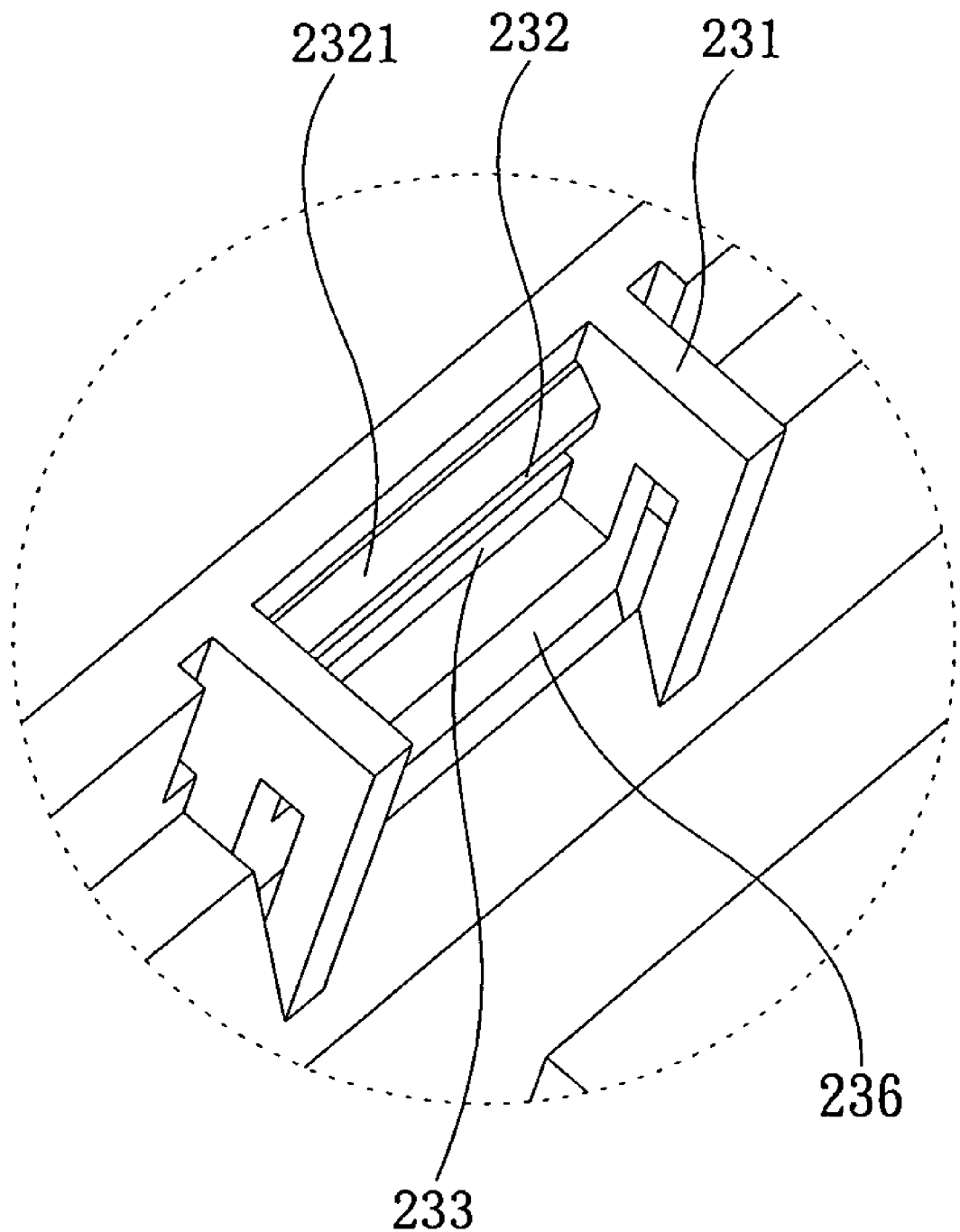
FIG. 7 is an amplified diagram of the second cover of the housing of the electronic apparatus of the first embodiment of the present invention in FIG. 2 for showing a wedging structure.
Figure 8:
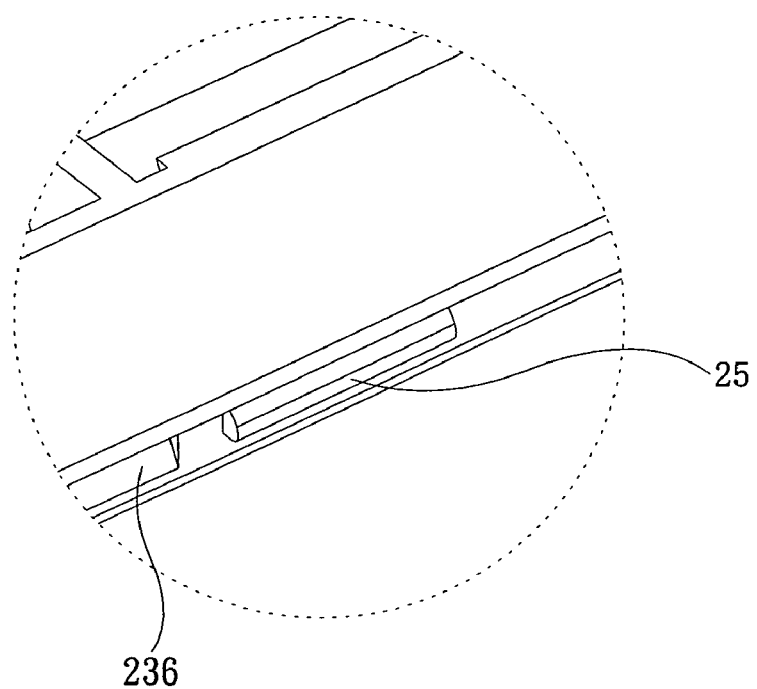
FIG. 8 is an amplified diagram of the second cover of the housing of the electronic apparatus of the first embodiment of the present invention for showing the structure of a convex part.

Reference is made to FIG. 1, which shows a schematic diagram of a housing 100 of an electronic apparatus of a first embodiment of the present invention. The housing 100 of the electronic apparatus includes a first cover 1, a second cover 2, and a third cover 3.

Reference is made to FIGS. 2-5 and FIGS. 11-12. The first cover 1 has a lower edge 10, an inner side wall 12, and an inner bottom surface 14. The inner bottom surface 14 extends downwards to form at least one wedging hook 11. In one preferred embodiment, the wedging hook 11 is integrally formed with the inner side wall 12 into one piece. The wedging hook 11 (See FIG. 3 for a top view amplification, and FIG. 5 for a bottom view amplification) has a flexible arm 111 and a hook portion 112 that is located at an end of the flexible arm 111, and the hook portion 112 protrudes outwards. The hook portion 112 has a slanted surface 1121.

Reference is made to FIG. 2, and FIGS. 6-9. The second cover 2 includes an upper edge 20, a lower edge 21, and a side wall located between the upper edge 20 and the lower edge 21. The side wall includes an inner side wall 22 and an outer side wall 24. The inner side wall 22 has at least one wedging structure 23 that matches the wedging hook 11. The second cover 2 has at least one convex part 25 which is located at the outer side wall 24 that is close to the lower edge 21.

The wedging structure 23 of the second cover 2 (See FIG. 7 for amplification) includes a pair of supporting ribs 231, a locking portion 232 having a slanted surface 2321, a separating portion 233, and a through hole 236 located at the side wall of the second cover 2 that is close to the lower edge 21 so that the inner space of the second cover 2 is communicated with the outer space thereof via the through hole 236. The through hole 236 extends into the supporting ribs 231. The locking portion 232 and the separating portion 233 each have a predetermined length in a lengthwise direction. The lengthwise direction of the locking portion 232 and the separating portion 233 is substantially parallel to the upper edge 20 of the second cover 2. The wedging structure 23 has a trough 234 formed between the locking portion 232 and the separating portion 233, thereby the locking portion 232 and the separating portion 233 are spaced at a predetermined distance. The supporting ribs 231 (see FIG. 7 for amplification) are respectively located at two ends of the locking portion 232 and the separating portion 233 in the lengthwise direction, and extend from the inner side wall 22 of the second cover 2. The supporting rib 231 has a top surface that has the same height as the upper edge 20 of the second cover 2. The top surface of the supporting rib 231 is used for supporting the lower edge 10 of the first cover 1. The supporting ribs 231 are used for enhancing the strength of the inner side wall and the outer side wall of the second cover 2 so as to lower the deformation of the housing 100 when under impact.

Reference is made to FIG. 2, and FIGS. 10-12. The third cover 3 includes an upper edge 30, an inner side wall 32, at least one concave opening 35 that is located at the inner side wall 32 and corresponds to the convex part 25 of the second cover 2, and at least one convex block 31 that extends upwards from the inner side wall 32 and corresponds to the through hole 236 of the wedging structure 23. The convex block 31 of the third cover 3 plugs into the wedging structure 23 of the second cover 2 via the through hole 236 of the second cover 2. The concave opening 35 of the third cover 3 can be locked-on with the convex part 25 of the second cover 2.

When the housing 100 of the electronic apparatus is assembled, the first cover 1 is wedged into the second cover 2. While being wedged, the hook portion 112 of the wedging hook 11 of the first cover 1 slides downwards along the slanted surface 2321 of the second cover 2 until the hook portion 112 of the wedging hook 11 of the first cover 1 extends into the trough 234 of the second cover 2 to lock-on with the locking portion 232 of the second cover 2. Thereby, the first cover 1 is connected with the second cover 2. Alternatively, the wedging hook 11 of the first cover 1 slides downwards along the locking portion 232 of the second cover 2 via the slanted surface 1121 (See FIG. 3 for amplification) of the hook portion 112 of the wedging hook 11 of the first cover 1 to extend into the trough 234 of the second cover 2 and lock-on with the locking portion 232 of the second cover 2. In other words, either the slanted surface 2321 of the locking portion 232 of the second cover 2 or the slanted surface 1121 of the wedging hook 11 of the first cover 1 can help the wedging hook 11 to slide downwards along the locking portion 232 to lock-on with the locking portion 232. Next, the convex block 31 of the third cover 3 plugs into the through hole 236 of the second cover 2 to make the convex block 31 to correspond to the side portion of the wedging hook 11 of the first cover 1 that is opposite to the hook portion 112 of the first cover 1. Thereby, the hook portion 112 of the first cover 1 cannot be escaped from the trough 234 of the second cover 2. The wedging hook 11 of the first cover 1 is stably locked-on with the wedging structure 23 of the second cover 2 so that the first cover 1 is firmly combined with the second cover 2 and the lower edge 10 of the first cover 1 corresponds with the upper edge 20 of the second cover 2. Because the convex block 31 of the third cover 3 is plugged, the upper edge 30 of the third cover 3 corresponds with the lower edge 21 of the second cover 2. At this time, the convex part 25 located on the outer side wall 24 of the second cover 2 is wedged into the concave opening 35 located on the inner side wall 32 of the third cover 3 so that the second cover 2 is firmly combined with the third cover 3.

Figure 9:
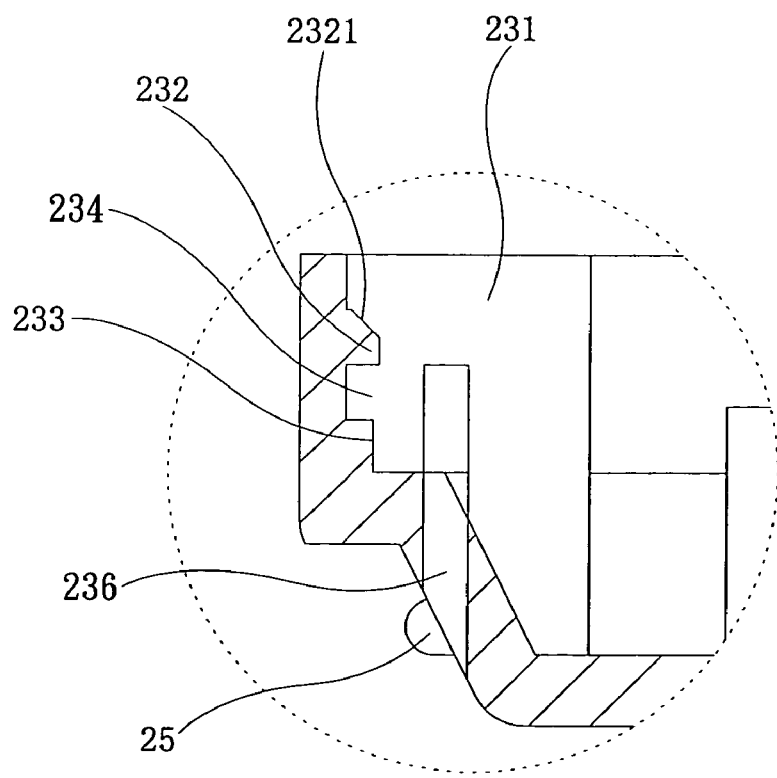
FIG. 9 is an amplified cross-sectional diagram of part of the second cover in FIG. 2 along AA cross-section.
Figure 10:
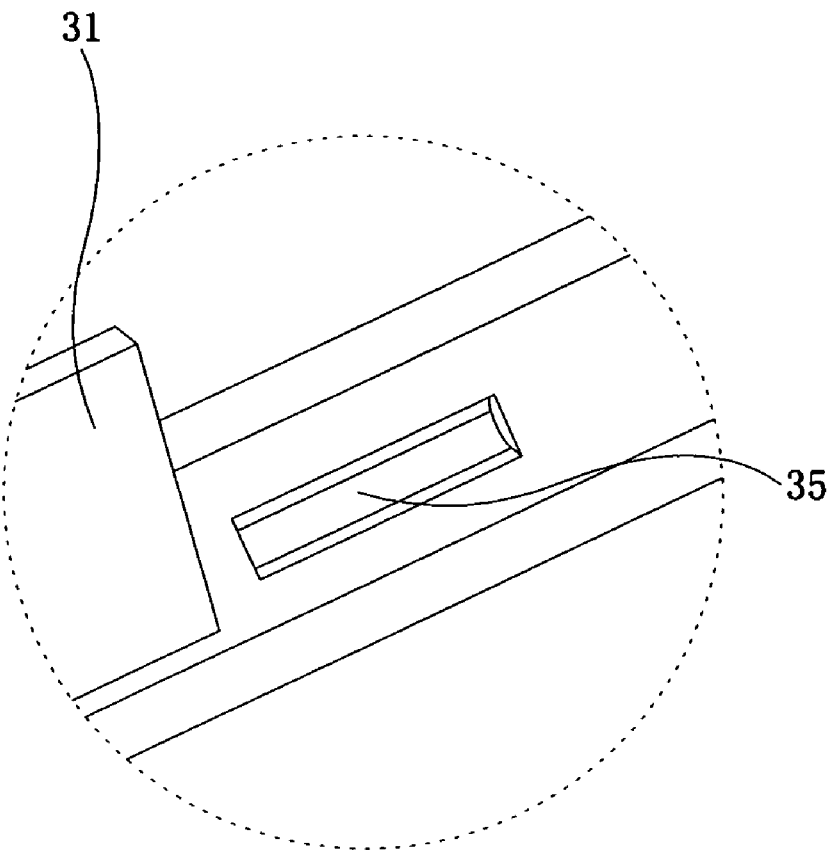
FIG. 10 is an amplified diagram of a third cover of the housing of the electronic apparatus of the first embodiment of the present invention for showing the structure of a concave opening.

Furthermore, the convex part 25 located on the outer side wall 24 of the second cover 2 preferably has an arc surface (see component 25 of FIG. 9). When the second cover 2 is combined with the third cover 3, the convex part 25 of the second cover 2 is wedged with the concave opening 35 of the third cover 3, but not extremely wedged, so that the second cover 2 and the third cover 3 can be easily disassembled. Alternatively, the convex part 25 can also be arranged on the third cover 3, and the concave opening 35 can be arranged on the second cover 2 to achieve the same effect.

The housing 100 of the electronic apparatus in this embodiment, the first cover 1, the second cover 2, and the third cover 3 form a stable structure by the wedging and locking between the wedging hook 11 of the first cover 1, the wedging structure 23 of the second cover 2, and the convex block 31 of the third cover 3. The housing 100 does not need to add extra elements, such as screws, for assembling. It will be a simple structure, a low cost and an easy assembly process due to the design of the housing 100 of the present invention.

Figure 11:
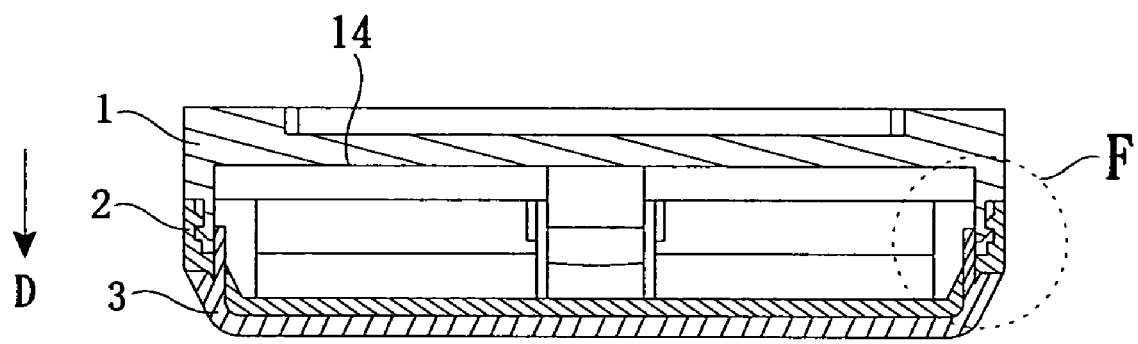
FIG. 11 is a cross-sectional diagram of the housing of the electronic apparatus of the first embodiment of the present invention along BB cross-section in FIG. 1.
Figure 12:
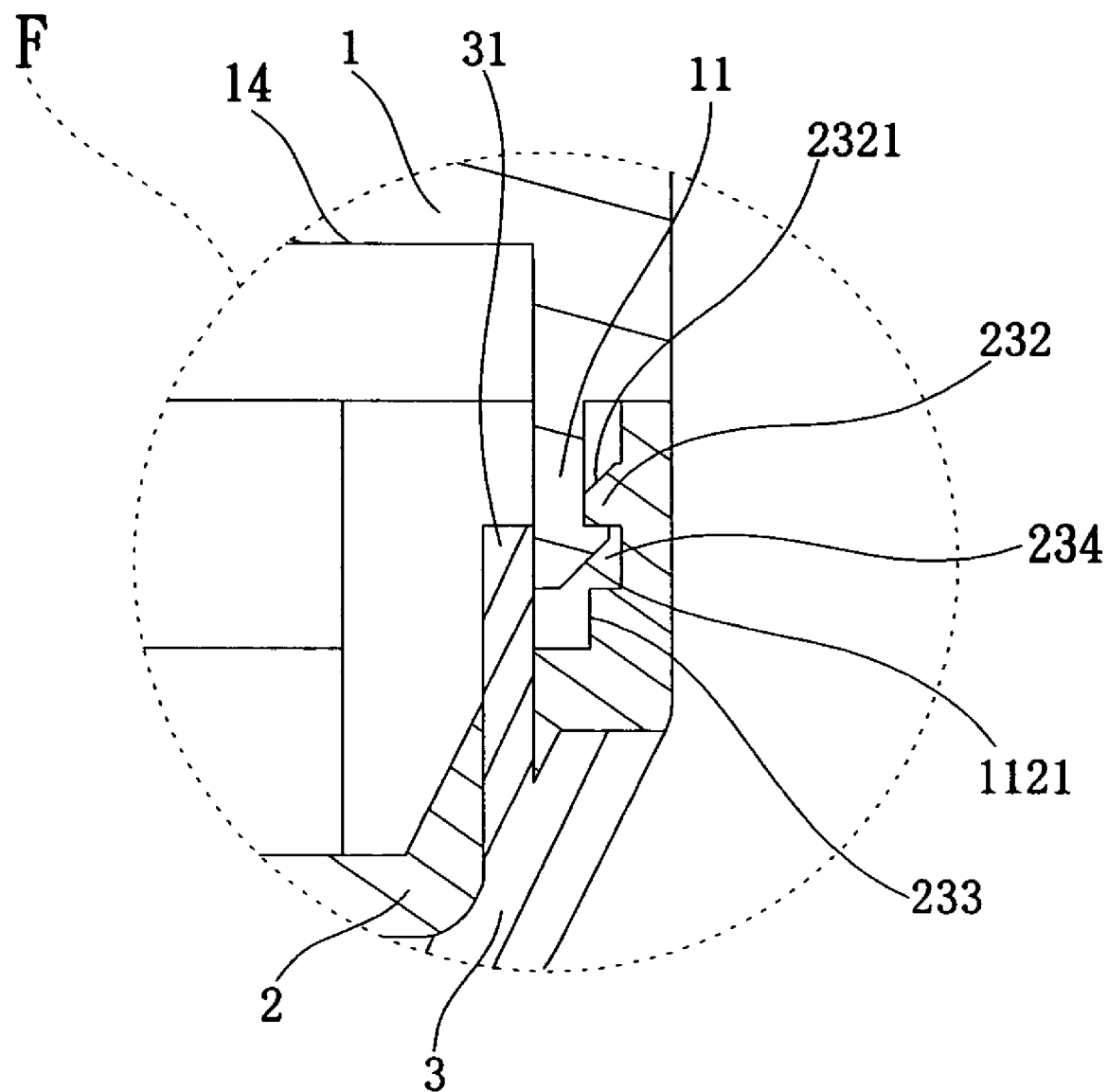
FIG. 12 is an amplified diagram of part F of the housing of the electronic apparatus of the first embodiment of the present invention in FIG. 11 for showing the third cover locking on the first cover with the second cover.

When the housing 100 of the electronic apparatus is disassembled, the third cover 3 is first pulled in a direction away from the second cover 2 (the direction of arrow D in FIG. 11). Since the convex part 25 located on the outer side wall 24 of the second cover 2 has an arc surface and the concave opening 35 on the third cover 3 has an arc concave surface, the convex part 25 on the second cover 2 will come off from the concave opening 35 on the third cover 3 due to the pulling force. Next, the third cover 3 is taken out from the second cover 2. At this time, the convex block 31 of the third cover 3 departs from the flexible arm 111 of the wedging hook 11 of the first cover 1. The hook portion 112 of the wedging hook 11 of the first cover 1 can be easily retracted from the trough 234 of the second cover 2. Thereby, the wedging hook 11 of the first cover 1 escapes from the wedging structure 23 of the second cover 2 so that the first cover 1 is separated from the second cover 2. As shown in the above described disassembling process, the disassembling of the housing 100 of the electronic apparatus is simple.

Figure 13:
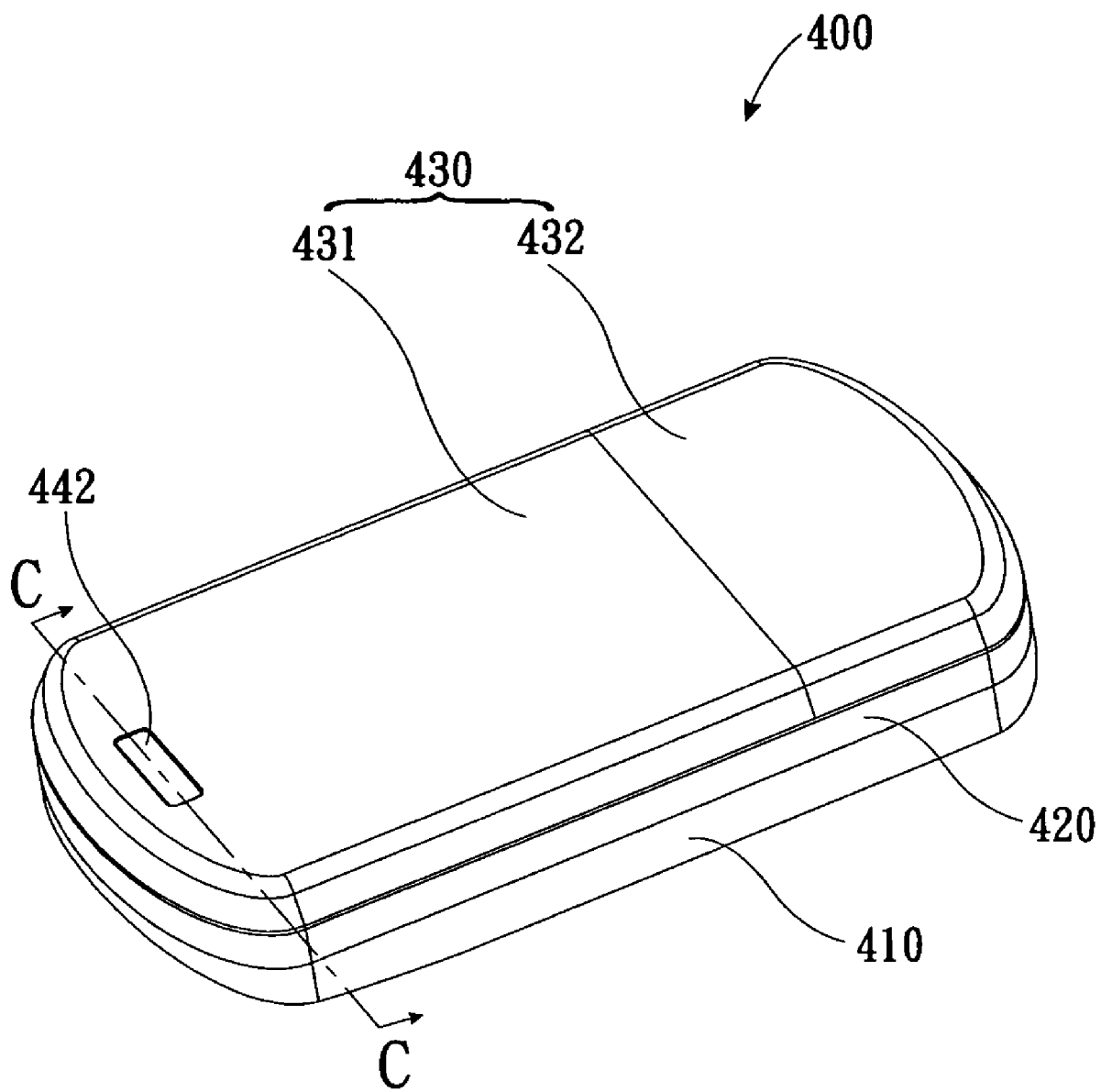
FIG. 13 is an assembly perspective view of the housing of the electronic apparatus of a second embodiment of the present invention.
Figure 14:
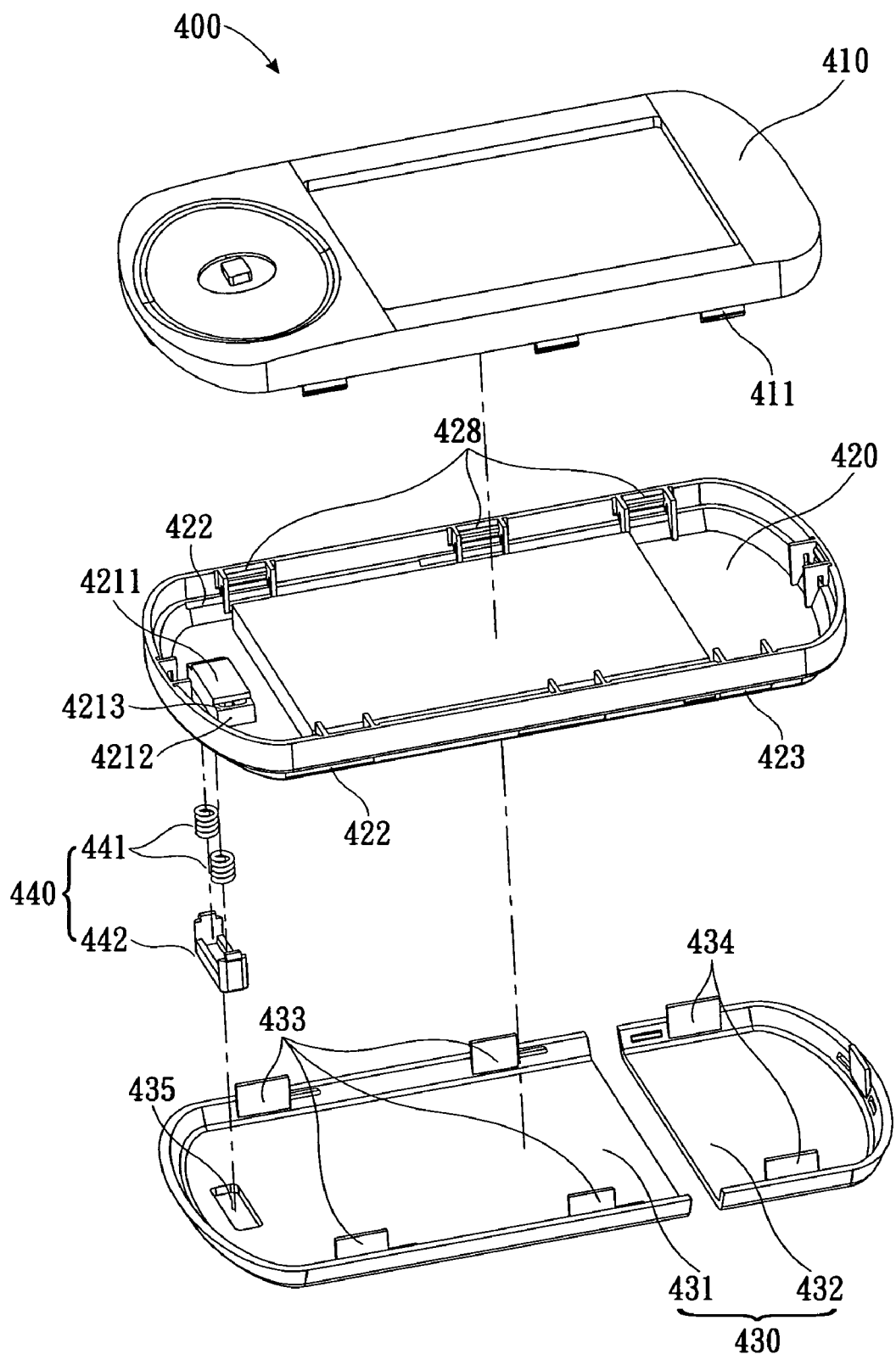
FIGS. 14 and 15 are exploded perspective views of the housing of the electronic apparatus of the second embodiment of the present invention.
Figure 15:
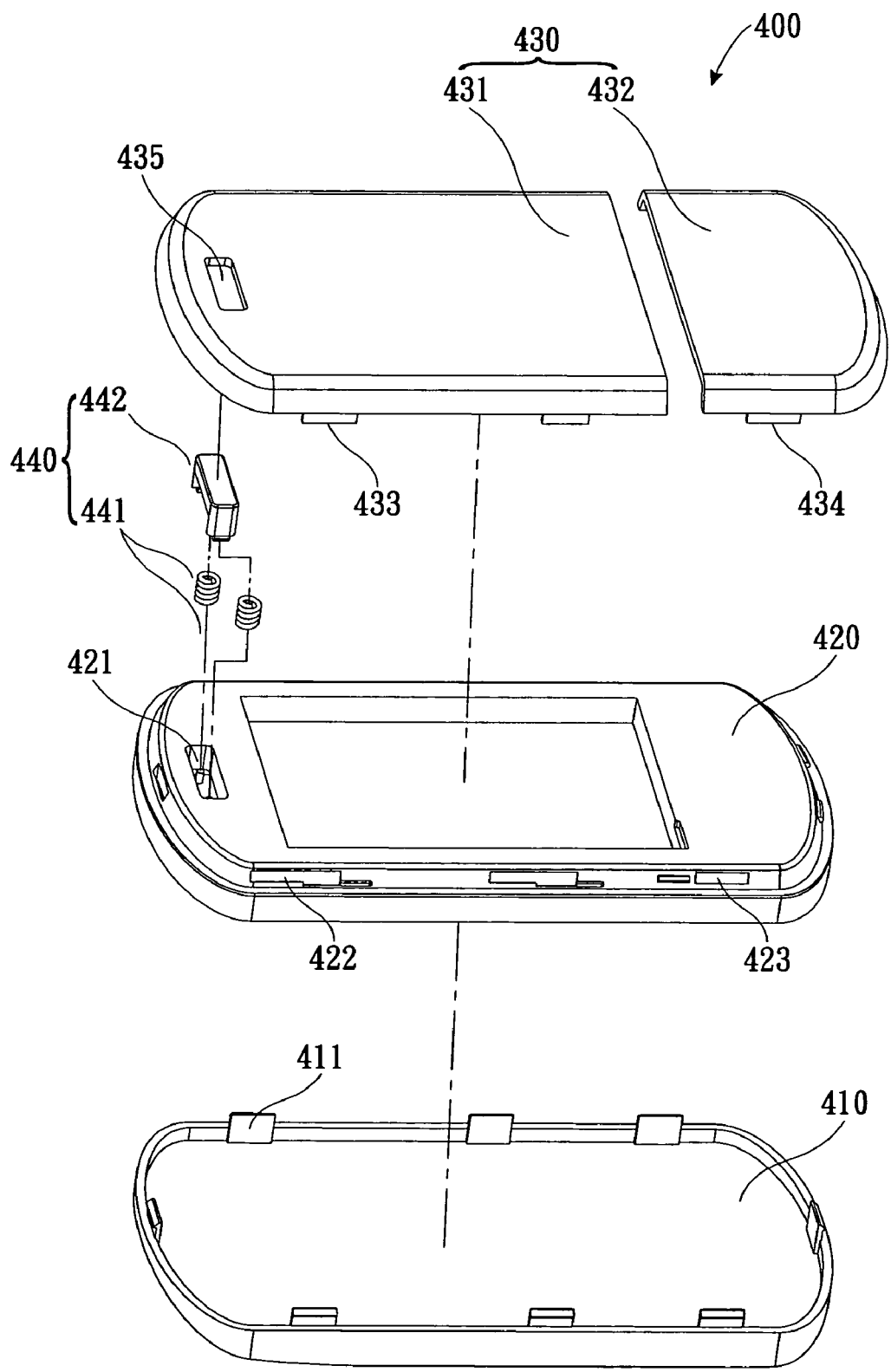

Reference is made to FIGS. 13-15. A housing 400 for an electronic apparatus of a second embodiment of the present invention includes a first cover 410, a second cover 420, and a third cover 430.

The first cover 410 also has a plurality of wedging hooks 411. The inner side wall of the second cover 420 has a plurality of corresponding wedging structures 428. The combination of the first cover 410 and the second cover 420 is implemented by the match between the wedging hooks 411 of the first cover 410 and the wedging structures 428 of the second cover 420.

The difference between the second embodiment and the first embodiment is that: the housing 400 of the electronic apparatus further comprises a flexible push-button 440. The flexible push-button 440 includes a pair of springs 441 and a press-key 442. The flexible push-button 440 is located on the second cover 420. One end of the joining surface of the second cover 420 and the third cover 430 has a concave trough 421. The flexible push-button 440 is received in the concave trough 421 of the second cover. When the housing 400 of the electronic apparatus is assembled, the press-key 442 of the flexible push-button 440 has the same height as the surface of the third cover 430.

Secondly, the third cover 430 includes a first portion 431 and a second portion 432. The first portion 431 of the third cover 430 has a hole 435 at one end thereof for receiving the press-key 442 of the flexible push-button 440. The edge of the first portion 431 of the third cover 430 for matching the edge of the second cover 420 extends to form at least one convex block 433. The edge of the second portion 432 of the third cover 430 for matching the second cover 420 extends to form at least one convex block 434.

The second cover 420 has at least one longer through hole 422 (first through hole) in the edge thereof for matching the first portion 431 of the third cover 430. The second cover 420 has at least one shorter through hole 423 (second through hole) in the edge thereof for matching the second portion 432 of the third cover 430. The through holes 422, 423 each are located on the location that corresponds to the wedging structure 428 on the inner side wall of the second cover 420. The shorter through hole 423 of the second cover 420 in the second embodiment is equivalent to the through hole 236 of the second cover 2 in the first embodiment. The convex block 434 on the second portion 432 of the third cover 430 can be directly plugged into the through hole 423 of the second cover 420. When the first cover 410 is combined with the second cover 420 and after the convex block 434 of the third cover 430 is plugged into the through hole 423 of the second cover 420, the top of the convex block 434 of the third cover 430 corresponds to the wedging hook 411 of the first cover 410 so as to prevent the wedging hook 411 of the first cover 410 from escaping from the wedging structure 428 on the inner side wall of the second cover 420 such that the first cover 410 is locked with the second cover 420 to achieve the same effect as the combination of the first cover 1 with the second cover 2 in the first embodiment. After the convex block 433 on the first portion 431 of the third cover 430 is plugged into the through hole 422 of the second cover 420, the first portion 431 of the third cover 430 slides for a distance to make the convex block 433 of the third cover 430 slide into the wedging structure 428 on the inner side wall of the second cover 420 and prevent the wedging hook 411 of the first cover 410 wedged in the wedging structure 428 of the second cover 420 from escaping from the wedging structure 428 in order to lock-on the first cover 410 with the second cover 420.

Figure 16:
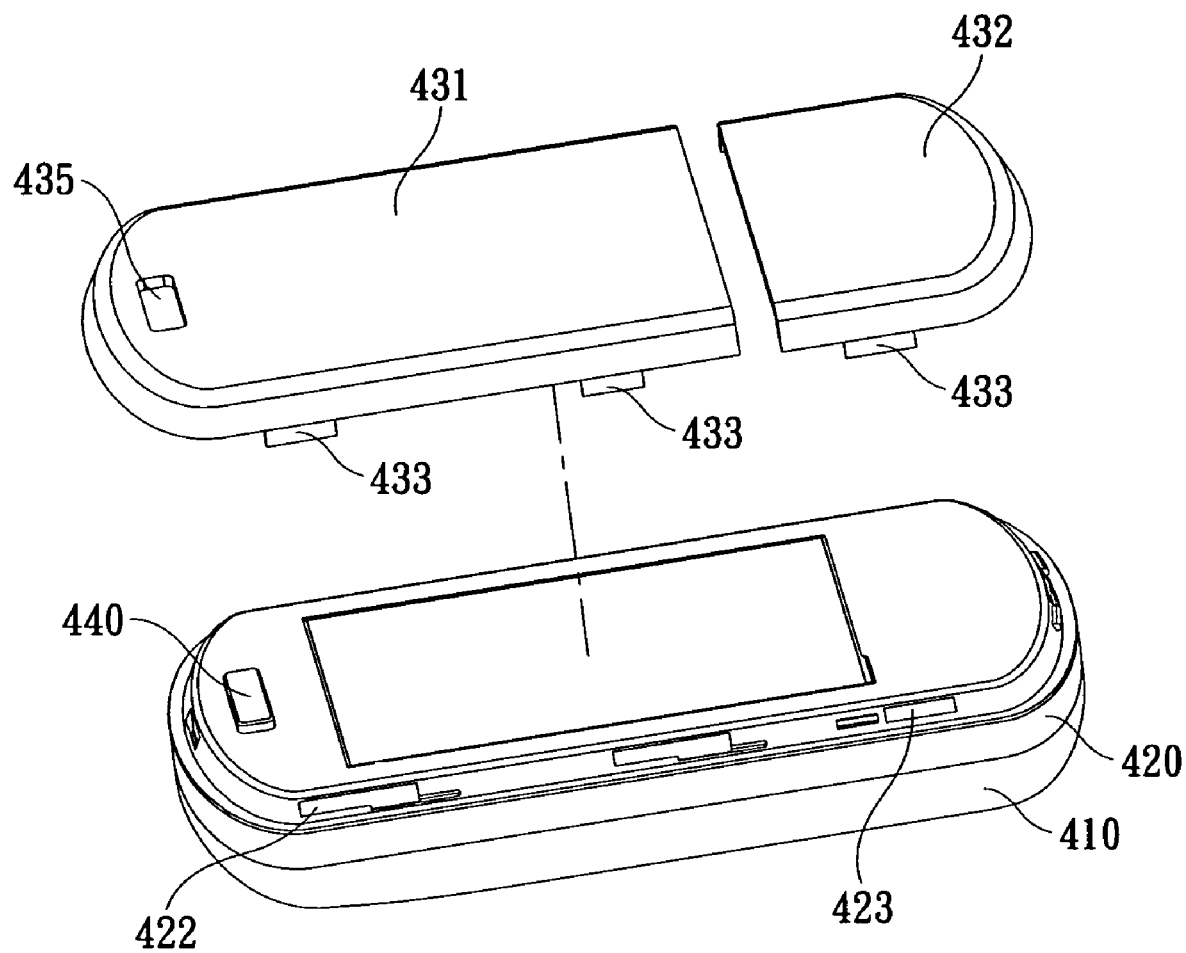
FIGS. 16, 17 and 18 are the schematic diagrams of the status of the assembly process of the housing of the electronic apparatus of the second embodiment of the present invention.
Figure 17:
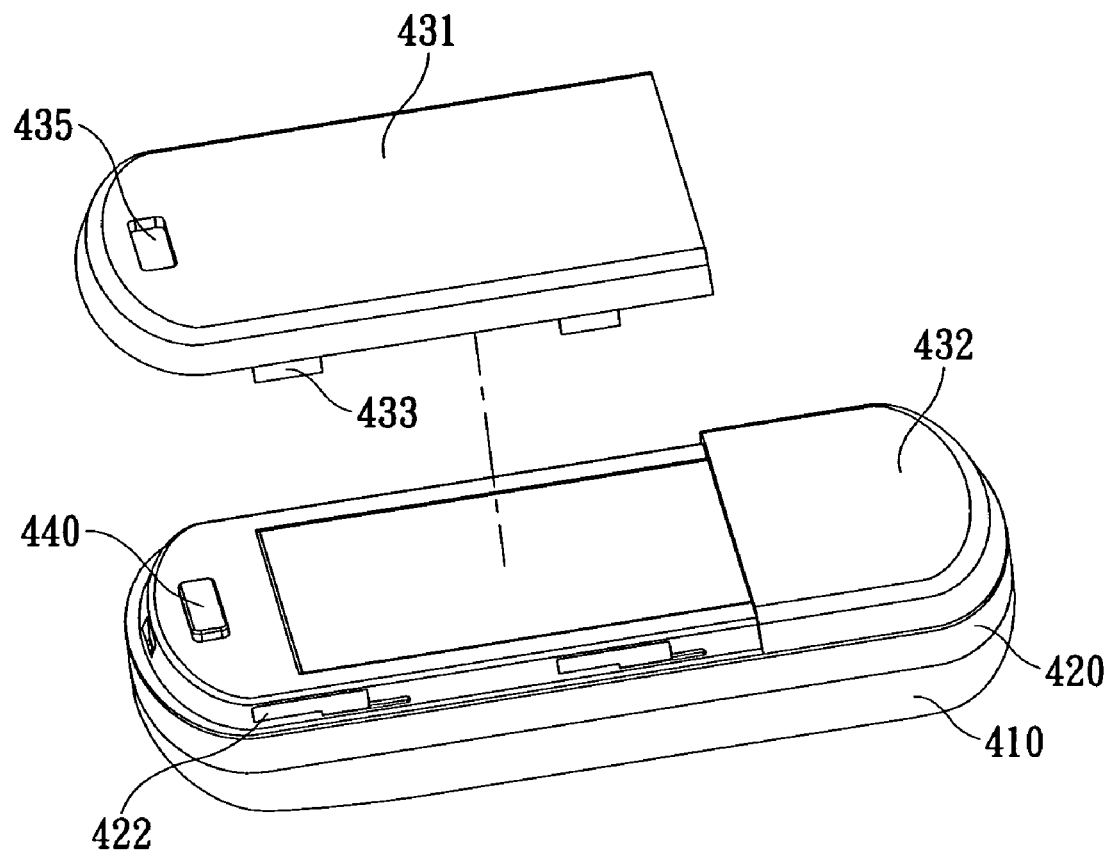
Figure 18:
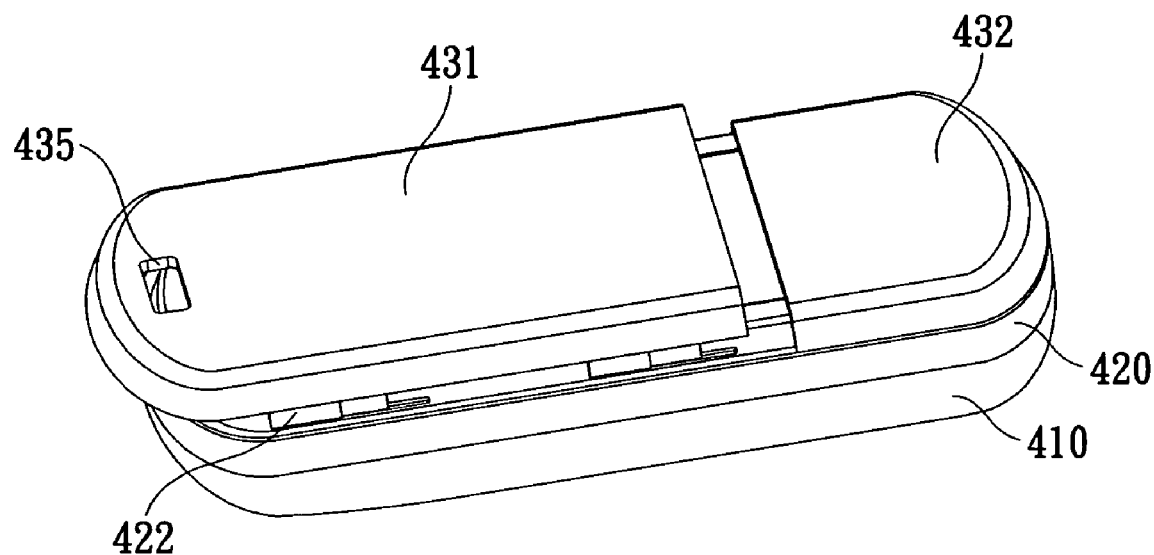

Reference is made to FIGS. 16-18, which show the schematic diagrams of the status of the assembly process of the housing of the electronic apparatus of the second embodiment of the present invention. Firstly, referring to FIG. 16, the first cover 410 is wedged with the second cover 420. The first cover 410 slides into the second cover 420 along the slanted surface of the wedging hook 411 of the first cover 410 (see FIG. 14) and locks with the wedging structure 428 of the second cover 420 (see FIG. 14). Referring to FIG. 17, the convex block 434 of the second portion 432 of the third cover 430 is plugged into the through hole 423 of the second cover 420. The second portion 432 of the third cover 430 is combined with the second cover 420, and the convex block 434 of the third cover 430 locks-on to the wedging between the wedging hook 411 of the first cover 410 and the wedging structure 428 of the second cover 420. Thereby, the first cover 410, the second cover 420, and the second portion 432 of the third cover 430 are assembled into one piece. Referring to FIG. 18, the convex block 433 of the first portion 431 of the third cover 430 is plugged into the through hole 422 of the second cover 420, and the first portion 431 slides forwards to second portion 432. When the first portion 431 slides forward and contacts the second portion 432, the convex block 433 of the third cover 430 slides into the wedging structure 428 of the second cover 420 to prevent the wedging hook 411 of the first cover 410 from escaping from the wedging structure 428 on the inner wall of the second cover 420, and lock-on the first cover 410 with the second cover 420. The press-key 442 of the flexible press-button 440 extends into the hole 435 of the first portion 431 due to the flexible force. At this time, the first portion 431 of the third cover 430, the first cover 410, and the second cover 420 is assembled into one piece. The housing 400 of the electronic apparatus is assembled, referring to FIG. 13.

The second embodiment also has the following similarity with the first embodiment. On both embodiments, the convex parts (i.e. convex part 25, convex block 31, convex block 433, and convex block 434) and the concave structures (i.e. concave opening 35 and through holes 422, 423) are arranged on the joining edge between the second cover 420 and the third cover 430 to enhance the stability of the joining of the second cover 420 and the third cover 430.

Figure 19:
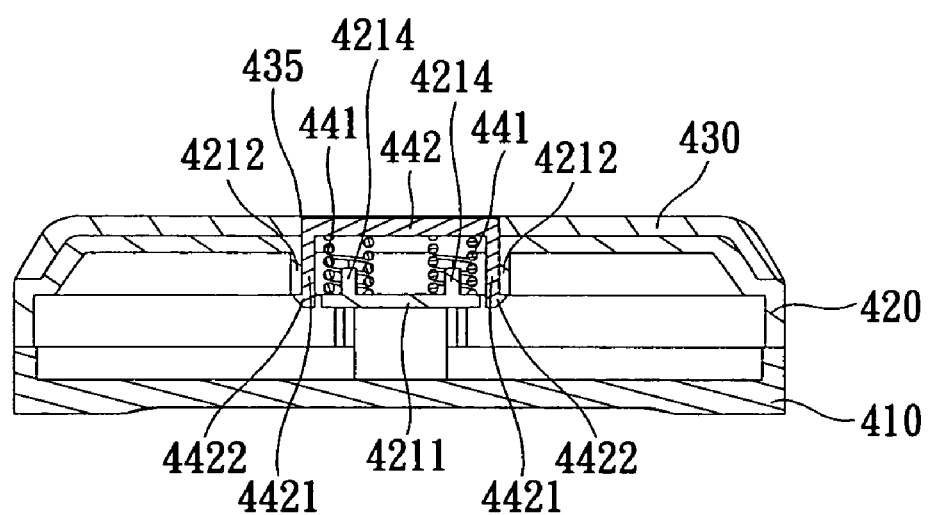
FIG. 19 is a cross-sectional diagram of the housing of the electronic apparatus of the second embodiment of the present invention along CC cross-section in FIG. 13.

The structure and function of the flexible press-button 440 is illustrated. Reference is made to FIGS. 14 and 19. The concave trough 421 of the second cover 420 has a bottom surface 4211 and two side walls 4212. There is a hollow portion 4213 between the bottom surface 4211 and the side walls 4212 of the second cover 420. The bottom surface 4211 of the second cover 420 has at least one stand column 4214. The flexible press-button 440 includes at least one spring 441 installed on the stand column 4214, and a press-key 442 located on the top of the spring 441. The press-key 442 extends downwards to form two flexible arms 4421. The end of the flexible arm 4421 is a hook portion 4422. The hook portion 4422 of the flexible press-button 440 extends into the hollow portion 4213 of the second cover 420 to hook the side wall 4212 of the second cover 420 so as to make the flexible press-button 440 be fastened into the concave trough 421 of the second cover 420 (see FIG. 15). When the housing 400 is assembled, the flexible press-button 440 is firmly held in the concave trough 421 of the second cover 420, as shown in FIG. 15. Under a pressing force, the press-key 442 can move downwards. This means that when the first portion 431 of the third cover 430 is combined with the second cover 420, the first portion 431 of the third cover 430 presses the press-key 442 of the flexible press-button 440 to move downwards. When the first portion 431 of the third cover 430 slides to the position where the hole 435 of the third cover 430 faces the flexible press-button 440, the press-key 442 is sprung back to the status shown in FIG. 15 due to the spring 441. Thereby, the press-key 442 extends into the hole 435 of the third cover 430 to tightly combine the first portion 431 of the third cover 430 with the second cover 420.

When the housing 400 of the electronic apparatus is disassembled, the flexible press-button 440 is pressed so that the first portion 431 of the third cover 430 slides to the direction that departs from the second portion 432. After the convex block 433 of the first portion 431 of the third cover 430 escapes from the wedging structure 428 on the inner side wall of the second cover 420, the first portion 431 can be taken out. Next, the process is the same as the first embodiment, the second portion 432 of the third cover 430, the second cover 420, and the first cover 410 are disassembled orderly.

The description above only illustrates specific embodiments and examples of the present invention. The present invention should therefore cover various modifications and variations made to the herein-described structure and operations of the present invention, provided they fall within the scope of the present invention as defined in the following appended claims.

What is claimed is:

1. A housing for an electronic apparatus, comprising:
a first cover having at least one wedging hook;
a second cover having at least one wedging structure that matches the wedging hook; and
a third cover having at least one convex block, wherein the convex block of the third cover extends into the wedging structure of the second cover to lock-on the wedging hook of the first cover with the wedging structure;
wherein the wedging structure of the second cover includes a locking portion, a separating portion, and a trough formed between the locking portion and the separating portion; so that the locking portion and the separating portion are spaced at a predetermined distance, and so that the wedging hook of the first cover is placed into the trough to lock-on with the locking portion of the second cover.

2. The housing as claimed in claim 1, wherein the wedging structure of the second cover further includes a pair of supporting ribs respectively located at two ends of the locking portion and the separating portion.

3. The housing as claimed in claim 1, wherein the locking portion of the second cover has a first slanted surface, and the wedging hook of the first cover slides into the trough of the wedging structure along the first slanted surface.

4. The housing as claimed in claim 3, wherein the wedging structure of the second cover further includes a pair of supporting ribs respectively located at two ends of the locking portion and the separating portion.

5. The housing as claimed in claim 1, wherein the wedging hook of the first cover has a second slanted surface, and the second slanted surface of the wedging hook slides into the trough of the wedging structure along the locking portion of the second cover.

6. The housing as claimed in claim 5, wherein the wedging structure of the second cover further includes a pair of supporting ribs respectively located at two ends of the locking portion and the separating portion.

7. The housing as claimed in claim 1, wherein the first cover includes an inner bottom surface, the wedging hook extends from the inner bottom surface, the second cover includes an inner side wall, the wedging structure is located on the inner side wall, the third cover includes an inner side wall, and the convex block extends from the inner side wall.

8. The housing as claimed in claim 7, wherein the locking portion and the separating portion protrude from the inner side wall of the second cover.

9. The housing as claimed in claim 7, wherein the second cover further includes an outer side wall and at least one convex part located on the outer side wall thereof, and the third cover includes at least one concave opening located on the inner side wall thereof, wherein the convex part of the second cover is wedged with the concave opening of the third cover.

10. The housing as claimed in claim 9, wherein the convex part of the second cover has an arc surface.

11. The housing as claimed in claim 7, wherein the second cover further includes an outer side wall and at least one concave opening located on the outer side wall thereof, and the third cover includes at least one convex part located on the inner side wall thereof, wherein the convex part of the third cover is wedged with the concave opening of the second cover.

12. The housing as claimed in claim 11, wherein the convex part of the third cover has an arc surface.

13. A housing for an electronic apparatus, comprising:
a first cover having at least one wedging hook;
a second cover having at least one wedging structure that matches the wedging hook; and
a third cover having at least one convex block, wherein the convex block of the third cover extends into the wedging structure of the second cover to lock-on the wedging hook of the first cover with the wedging structure;
wherein the wedging structure of the second cover includes a through hole that communicates with an inner space and an outer space of the second cover, the through hole is located on an edge of the second cover for joining the third cover, so that the convex block of the third cover extends into the wedging structure of the second cover via the through hole.

14. A housing for an electronic apparatus, comprising:
a first cover having at least one wedging hook;
a second cover having at least one wedging structure that matches the wedging hook; and
a third cover having at least one convex block, wherein the convex block of the third cover extends into the wedging structure of the second cover to lock-on the wedging hook of the first cover with the wedging structure;

wherein the third cover includes a first portion and a second portion, the at least one convex block on the second portion of the third cover is directly plugged into the corresponding wedging structure of the second cover, the at least one convex block on the first portion of the third cover extends into the wedging structure of the second cover via a sliding way.

15. The housing as claimed in claim 14, wherein the second cover includes at least one first through hole and at least one second through hole, both the first through hole and the second through hole are located on an edge of the second cover for joining the third cover, wherein the length of the first through hole is longer than the length of the second through hole, the convex block of the second portion of the third cover plugs into the corresponding wedging structure of the second cover via the second through hole, and the convex block of the first portion of the third cover plugs into the second cover via the first through hole and slides into the corresponding wedging structure of the second cover along a predetermined direction that is close to the second portion of the third cover.

* * * * *